US012772913B2

(12) United States Patent
Chen et al.

(10) Patent No.: US 12,772,913 B2
(45) Date of Patent: Oct. 20, 2026

(54) METHOD FOR MANUFACTURING ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 325 days.

(21) Appl. No.: 18/733,923

(22) Filed: Jun. 5, 2024

(65) Prior Publication Data

US 2025/0015058 A1 Jan. 9, 2025

(30) Foreign Application Priority Data

Jul. 3, 2023 (CN) ......................... 202310798854.8

(51) Int. Cl.

| | |
|---|---|
| ***H10W 90/00*** | (2026.01) |
| ***H10H 20/01*** | (2025.01) |
| ***H10H 20/84*** | (2025.01) |
| ***H10H 29/02*** | (2025.01) |

(52) U.S. Cl.

CPC .......... *H10W 90/00* (2026.01); *H10H 20/034* (2025.01); *H10H 20/84* (2025.01); *H10H 29/02* (2025.01)

(58) Field of Classification Search

CPC .............................. H10W 90/00; H10H 29/02

See application file for complete search history.

(56) References Cited

U.S. PATENT DOCUMENTS

2022/0189810 A1 6/2022 Hwang
2022/0189931 A1 6/2022 Hwang
2022/0285581 A1 9/2022 Hong

*Primary Examiner* — Matthew L Reames

(74) *Attorney, Agent, or Firm* — Winston Hsu

(57) ABSTRACT

A method for manufacturing an electronic device includes following steps: providing a substrate structure having a plurality of recesses, wherein each of the plurality of recesses has a first portion and a second portion connected to the first portion, and an area of the first portion is greater than an area of the second portion; providing a plurality of electronic units to the plurality of recesses; detecting a location of at least one of the plurality of electronic units, so as to determine whether the at least one of the plurality of electronic units is disposed in one of the second portions of the plurality of recesses; and positioning the at least one of the plurality of electronic units in the one of the second portions of the plurality of recesses when the at least one of the plurality of electronic units is disposed in a defective location.

15 Claims, 13 Drawing Sheets

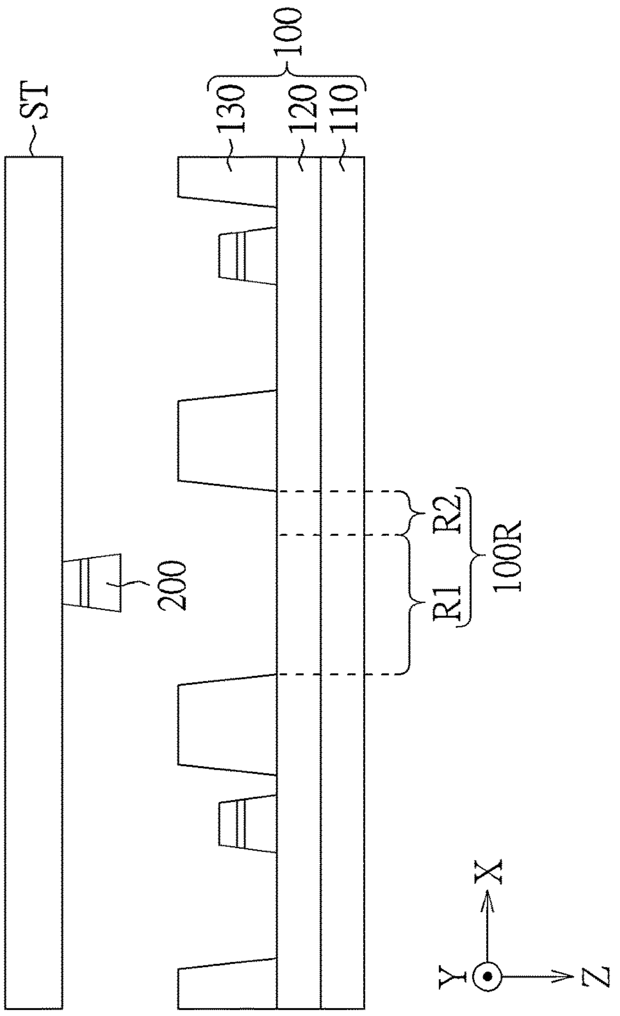
FIG. 8
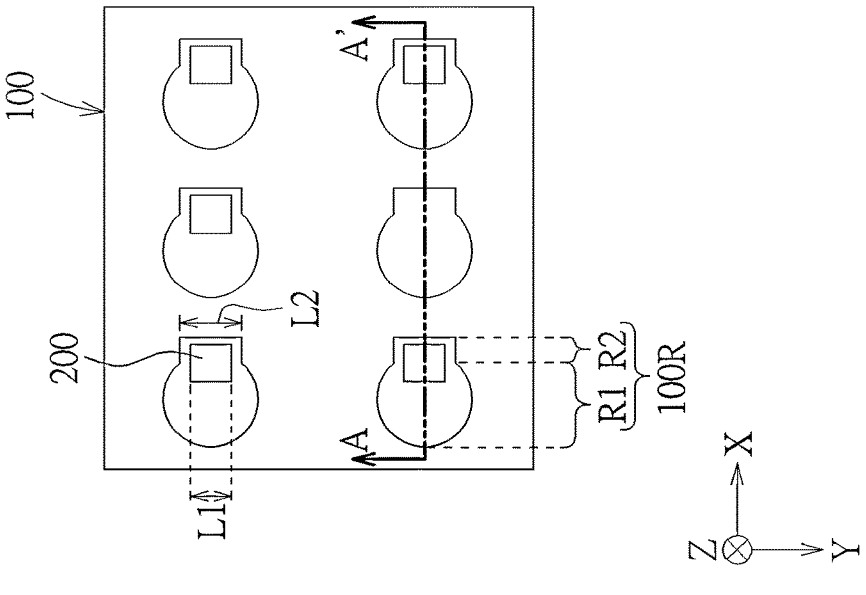

METHOD FOR MANUFACTURING ELECTRONIC DEVICE

BACKGROUND OF THE DISCLOSURE

1. Field of the Disclosure

The present disclosure relates to a method for manufacturing an electronic device, and more particularly to a method for manufacturing an electronic device including steps of disposing electronic units and detecting and repairing the abnormality.

2. Description of the Prior Art

In the current technology, electronic units can be massively transferred to the substrate in by mass transfer technologies such as a fluid transfer process. For example, electronic units may be massively transferred by dropping liquid containing the electronic units on the substrate. However, during the fluid transfer process, since the electronic units cannot be disposed in an orderly manner, it may cause abnormal distribution and/or electrical connection of the electronic units, thereby affecting the product yield.

SUMMARY OF THE DISCLOSURE

One of the objectives of the present disclosure is to provide a method for manufacturing an electronic device, so as to solve the problems encountered by the conventional manufacturing methods for manufacturing electronic devices. Through the design of recesses of the substrate structure, it may be beneficial for disposing electronic units. In addition, by detecting the location of the electronic unit and repairing the abnormality during the manufacturing process, the yield and/or reliability of the product may be improved.

The present disclosure provides a method for manufacturing an electronic device, which includes following steps: providing a substrate structure having a plurality of recesses, wherein each of the plurality of recesses has a first portion and a second portion connected to the first portion, and an area of the first portion is greater than an area of the second portion; providing a plurality of electronic units to the plurality of recesses; detecting a location of at least one of the plurality of electronic units, so as to determine whether the at least one of the plurality of electronic units is disposed in one of the second portions of the plurality of recesses; and positioning the at least one of the plurality of electronic units in the one of the second portions of the plurality of recesses when the at least one of the plurality of electronic units is disposed in a defective location.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 8 is a schematic diagram illustrating a portion of the process of a method for manufacturing an electronic device according to an embodiment of the present disclosure.

DETAILED DESCRIPTION

Figure 1:
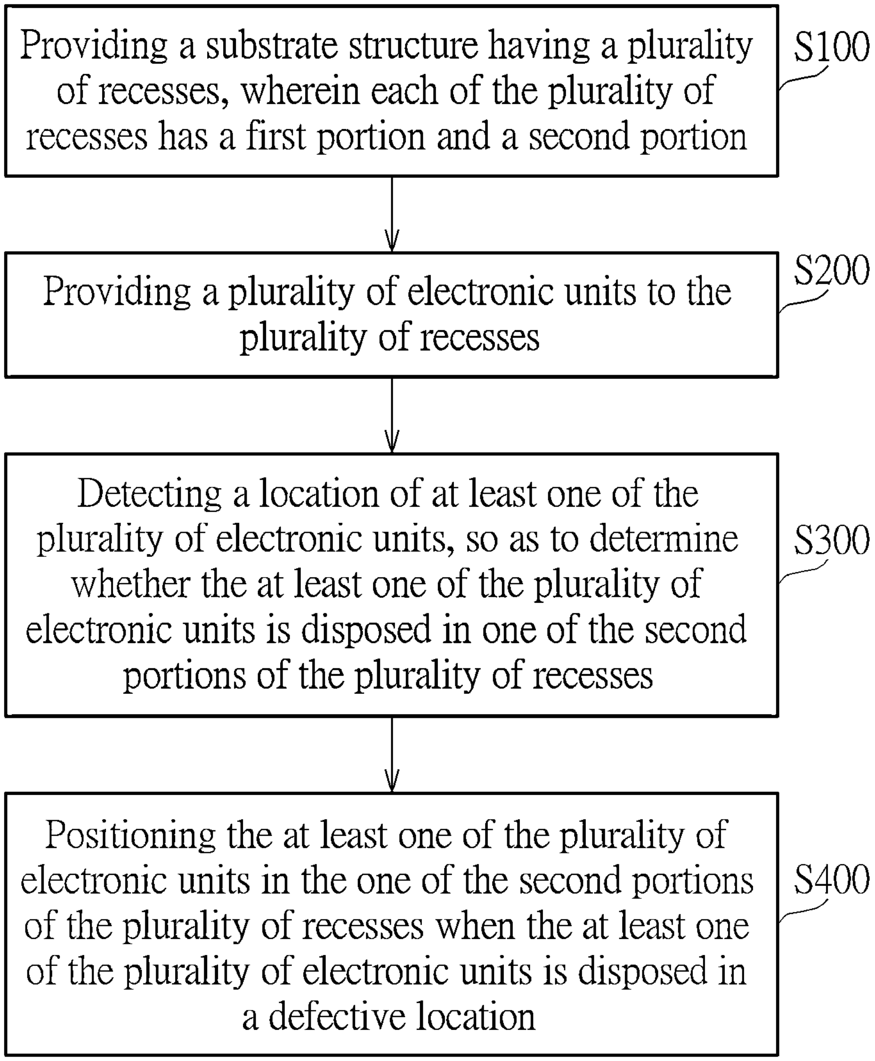
FIG. 1 is a flowchart of a method for manufacturing an electronic device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms “include”, “comprise” and “have” are used in an open-ended fashion, and thus should be interpreted to mean “include, but not limited to . . . ”. When the terms “include”, “comprise” and/or “have” are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being “on” or “connected to” another element or layer, it may be directly on or directly connected to the other element or layer, or intervening elements or layers may be presented (indirect condition). In contrast, when an element is referred to as being “directly on” or “directly connected to” another element or layer, there are no intervening elements or layers presented.

The directional terms mentioned in this document, such as “up”, “down”, “front”, “back”, “left”, “right”, etc., are only directions referring to the drawings. Therefore, the directional terms used are for illustration, not for limitation of the present disclosure.

The terms “about”, “equal”, “identical” or “the same”, and “substantially” or “approximately” mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

In the present disclosure, a size of an element or layer such as the thickness, area, width or height and the comparison between sizes may be measured and determined by an optical microscope (OM) or a scanning electron microscope (SEM). For example, a same image or more than one image obtained may be used for the measurement and determination.

The electronic device of the present disclosure may be applied to a display device, a light emitting device, a backlight device, an antenna device, a sensing device or a tiled device, or applied to a temporary substrate for assisting electronic units to be placed with a specific interval, but not limited herein. The electronic device may include a bendable or flexible electronic device. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. The diode may include a light-emitting diode or a photodiode. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein. In addition, the appearance of the electronic device may be a rectangle, a circle, a polygon, a shape with curved edges or other suitable shapes.

It should be noted that the technical features in different embodiments described in the following can be replaced, recombined, or mixed with one another to constitute another embodiment without departing from the spirit of the present disclosure.

Figure 2:
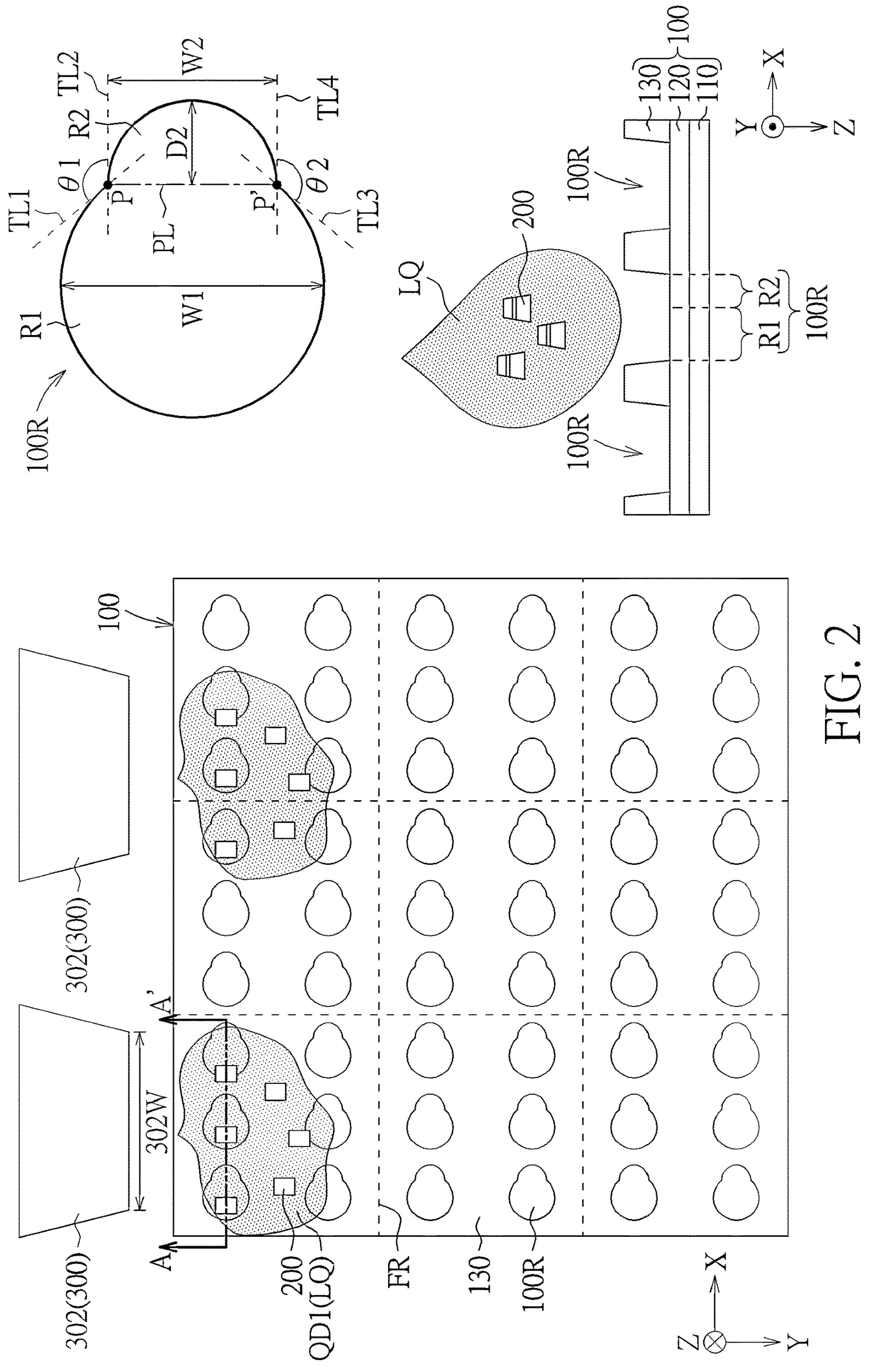
FIG. 2 to FIG. 6 are schematic diagrams illustrating a portion of the process of a method for manufacturing an electronic device according to an embodiment of the present disclosure.
Figure 3:
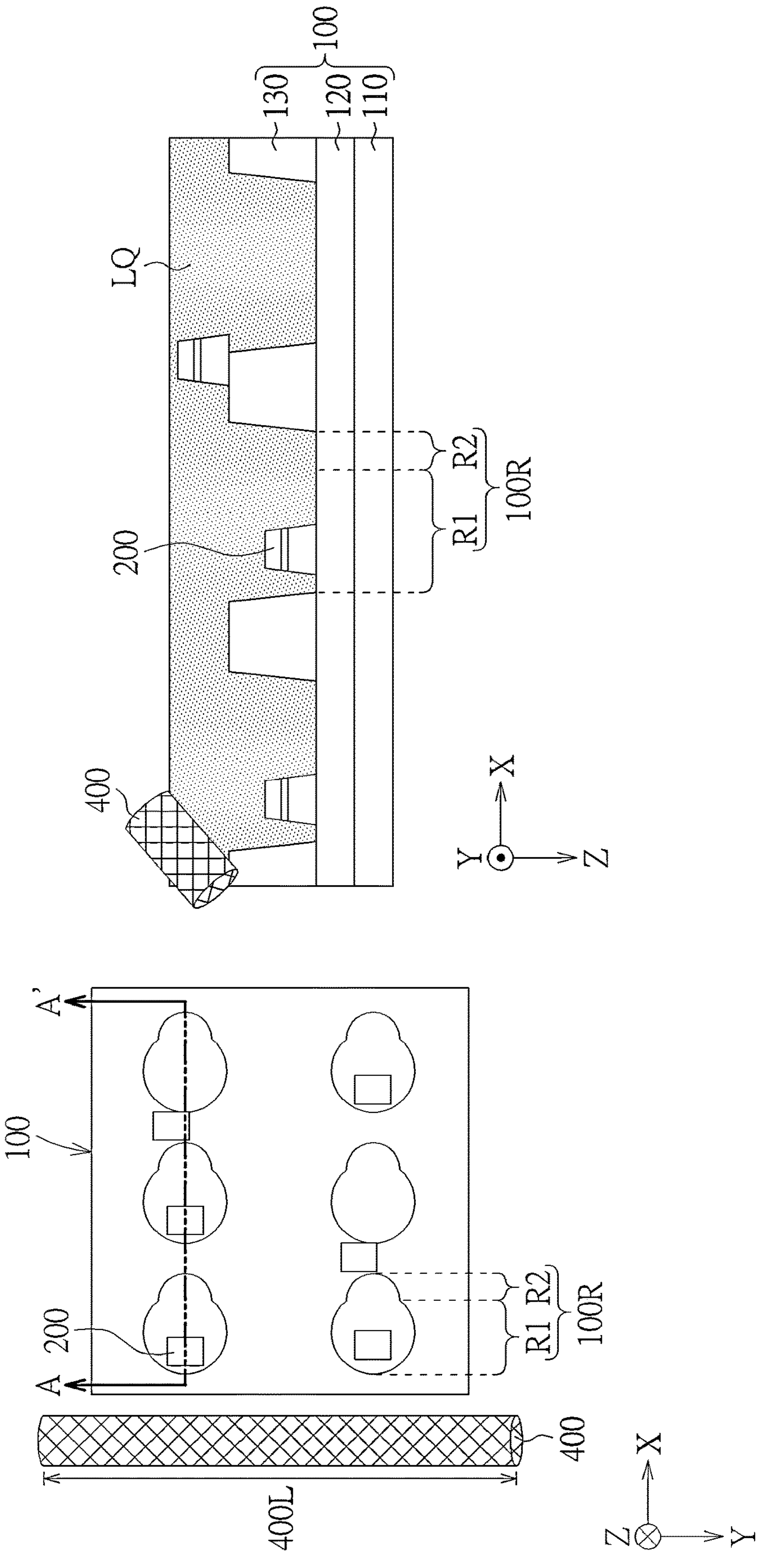
Figure 4:
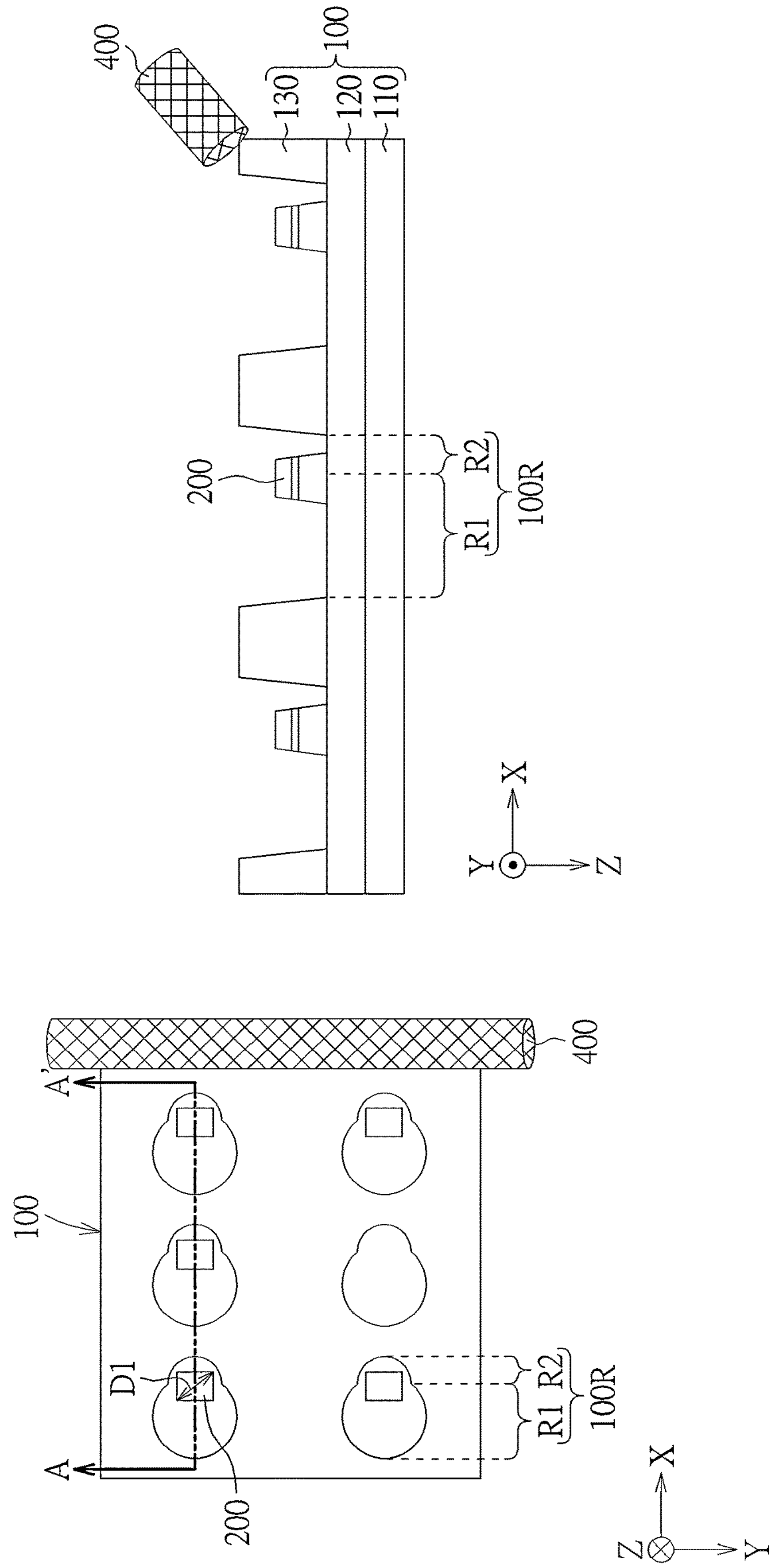
Figure 5:
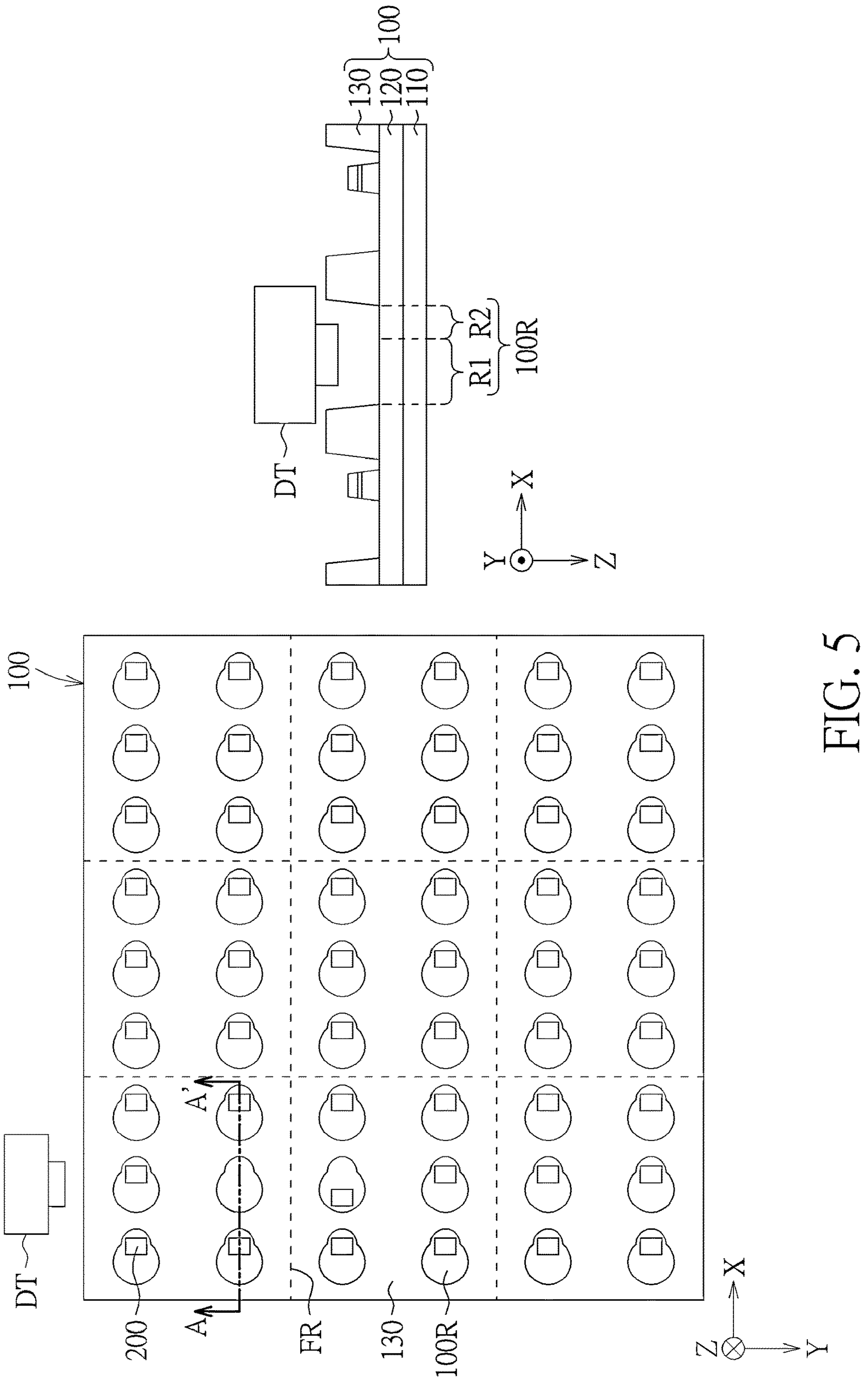
Figure 6:
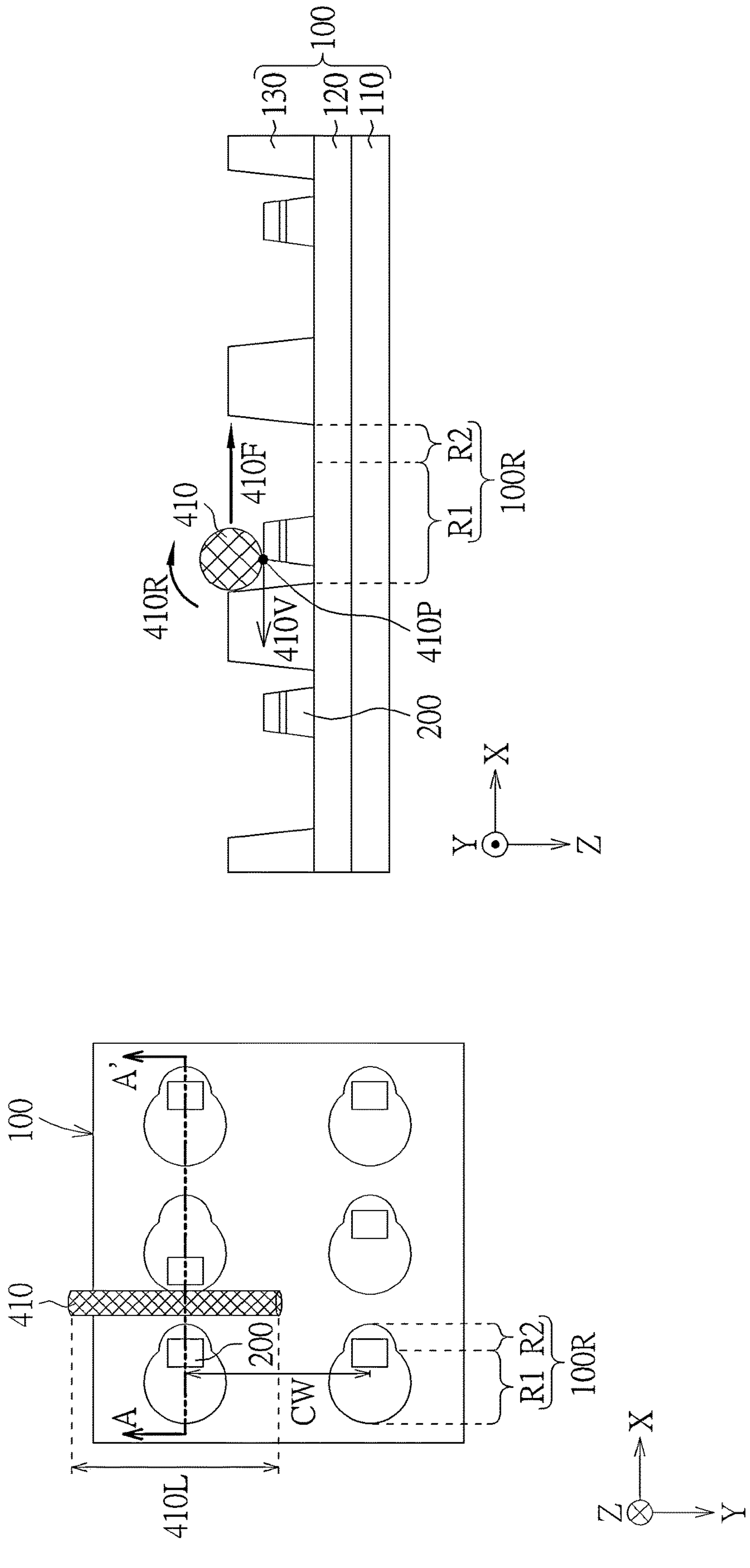

Please refer to FIG. 1 and FIG. 2 to FIG. 6. FIG. 1 is a flowchart of a method for manufacturing an electronic device according to an embodiment of the present disclosure. FIG. 2 to FIG. 6 are schematic diagrams illustrating a portion of the process of a method for manufacturing an electronic device according to an embodiment of the present disclosure, wherein the left part of FIG. 2 schematically shows a top-view diagram of the process, the upper-right part of FIG. 2 schematically shows a partially enlarged top-view of one of the recesses shown in the top-view of the left part of FIG. 2, the lower-right part of FIG. 2 schematically shows a partial cross-sectional view of the process corresponding to the section line A-A' in the top-view of the left part of FIG. 2, the left parts of FIG. 3, FIG. 4 and FIG. 6 schematically show a partial top-view of the process respectively, the left part of FIG. 5 schematically shows a top-view of the process, and the right parts of FIG. 3 to FIG. 6 schematically show partial cross-sectional view of the process corresponding to the section lines A-A' in the left top-views of the same figures respectively. As shown in FIG. 1 and FIG. 2 to FIG. 6, a method for manufacturing an electronic device according to an embodiment of the present disclosure includes Step S100, Step S200, Step S300 and Step S400, as detailed in the following. As shown in Step S100 and FIG. 2, first, a substrate structure 100 is provided. The substrate structure 100 has a plurality of recesses 100R, and each of the plurality of recesses 100R has a first portion R1 and a second portion R2, wherein the second portion R2 is connected to the first portion R1, and an area of the first portion R1 is greater than an area of the second portion R2. As shown in FIG. 2, the substrate structure 100 may be divided into a plurality of regions FR, and one region FR may include a plurality of recesses 100R. The substrate structure 100 may include, for example (but not limited to), a 3*3 array of regions FR, which is nine regions FR in total, and the top views at the left parts of FIG. 3, FIG. 4 and FIG. 6 respectively show one of the regions FR.

Figure 10:
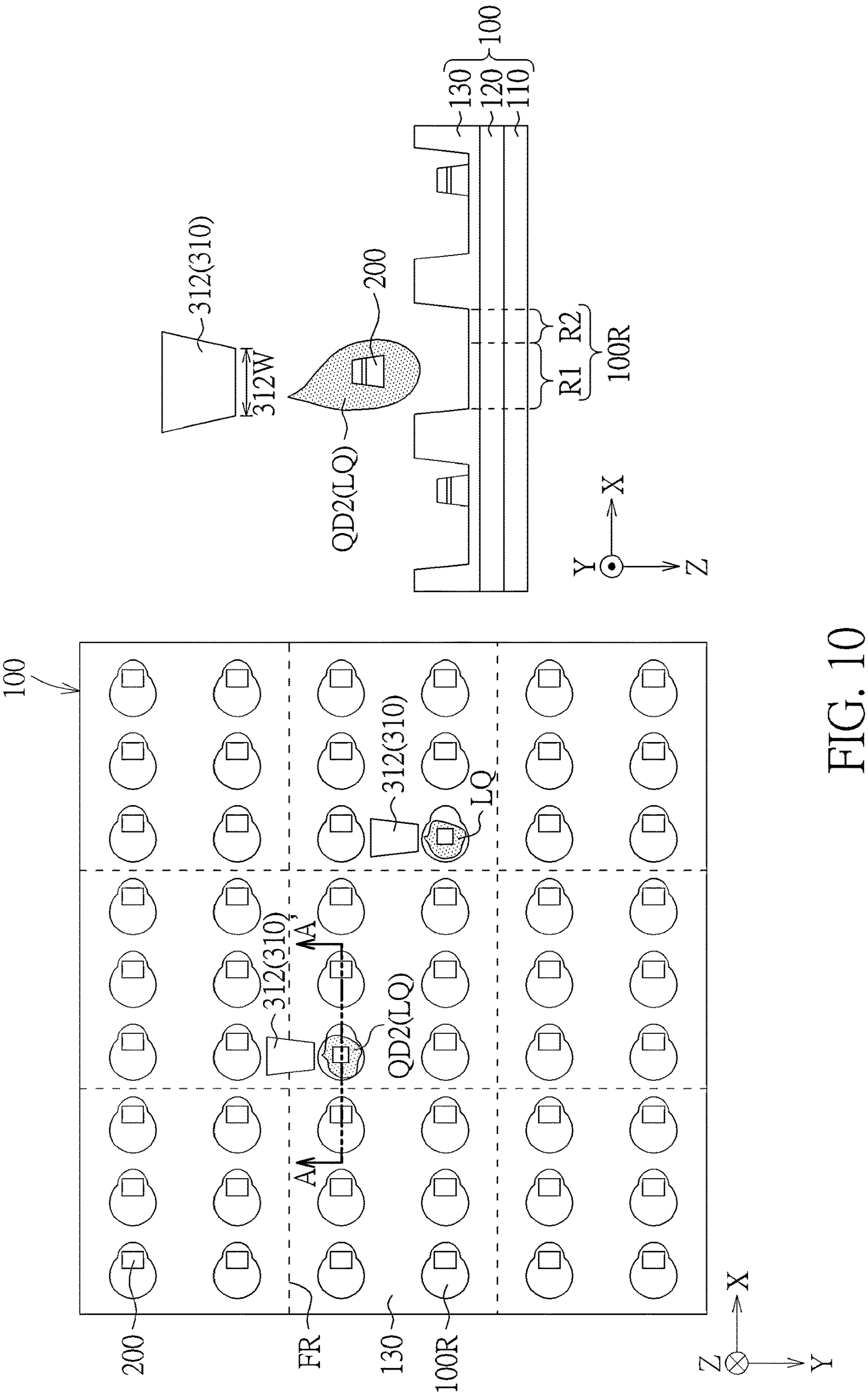
FIG. 10 is a schematic diagram illustrating a portion of the process of a method for manufacturing an electronic device according to an embodiment of the present disclosure.

The substrate structure 100 may include a base layer 110, an insulating layer 120 and an insulating layer 130. The insulating layer 120 is disposed on the base layer 110, and the insulating layer 130 is disposed on the insulating layer 120 and at least partially overlapped with the insulating layer 120 in a direction Z. The plurality of recesses 100R are formed in the insulating layer 130, wherein the recesses 100R may pass through the insulating layer 130 to expose the insulating layer 120 (as shown in FIG. 2), or the recesses 100R may not penetrate through the insulating layer 130 and form hollow portions in the insulating layer 130 (as shown in FIG. 10) without exposing the insulating layer 120. The direction Z mentioned in the present disclosure may be a top-view direction of the electronic device, that is, the direction parallel to a normal direction of the substrate structure 100 or the base layer 110. For example, the plurality of recesses 100R may be arranged as an array, that is, arranged in a plurality of rows extending along a direction X with that these rows are arranged side-by-side along a direction Y, wherein the direction X and the direction Y may be perpendicular to each other and perpendicular to the direction Z meanwhile. For example, the direction X may be parallel to a horizontal direction and the direction Y may be perpendicular to the direction X, but not limited herein. The material of the base layer 110 may include a hard material or a flexible material. For example, the hard material may include glass, quartz, sapphire, ceramics, other suitable materials or combinations of the above materials, and the flexible material may include polyimide (PI), polycarbonate (PC), polyethylene terephthalate (PET), other suitable materials or combinations of the above materials, but not limited herein. The insulating layer 120 and the insulating layer 130 may include organic materials, inorganic materials or other suitable insulating materials. The substrate structure 100 may further include a circuit layer (not shown) disposed on the base layer 110, and the circuit layer may include, for example (but not limited to), circuits, wires, electronic elements and/or bonding pads. In some embodiments, the circuit layer may be disposed between the insulating layer 120 and the insulating layer 130, but not limited herein.

The first portion R1 and the second portion R2 of each recess 100R are demarcated by the shortest line connecting two opposite obvious turning points of the recess contour (i.e., outline of the recess, for example, the obvious inner edge or outer edge observed from the top view). For example, in the partially enlarged view of the recess 100R shown in the upper-right of FIG. 2, it may be observed that the two obvious turning points of the recess contour are a point P and a point P', and the line segment with the shortest distance from point P to point P' (represented by a virtual line PL) demarcates the first portion R1 at the left side and the second portion R2 at the right side. In some embodiments, as shown in FIG. 2, at each one of the junctions of the contour of the first portion R1 and the contour of the second portion R2, the contour of the first portion R1 has a first slope, the contour of the second part R2 has a second slope, and the first slope is different from the second slope, that is, the above junctions are the obvious turning points, the point P and the point P'. For example, a tangent line TL1 of the contour of the first portion R1 at the point P is not parallel to a tangent line TL2 of the contour of the second portion R2 at the point P, that is, the slopes of the tangent line TL1 and the line tangent TL2 are different or an included angle θ1 greater than 0 (e.g., greater than 90 degrees) exists therebetween. Similarly, a tangent line TL3 of the contour of the first portion R1 at the point P' is not parallel to a tangent line TL4 of the contour of the second portion R2 at the point P', that is, the slopes of the tangent line TL3 and the tangent line TL4 are different or an included angle θ2 greater than 0 (e.g., greater than 90 degrees) exists therebetween. In other words, when the tangent lines on the left side and the right side of any point at the contour of the recess 100R have an included angle, the above point may be regarded as an obvious turning point of the contour. Alternatively, when the contour of one of the left side and the right side of any point at the contour of the recess 100R is located outside the tangent line of the other side, the above point is regarded as an obvious turning point of the contour. According to the present disclosure, a size of the first portion R1 is greater than a size of the second portion R2 in each recess 100R. For example, a projected area of the first portion R1 is greater than a projected area of the second portion R2 in the direction Z, or a bottom area of the first portion R1 is greater than a bottom area of the second portion R2, or the maximum width W1 of the first portion R1 is greater than the maximum width W2 of the second portion R2 in the direction Y, or the maximum width (not labeled) of the first portion R1 is greater than the maximum width (not labeled) of the second portion R2 in the direction X.

After Step S100, Step S200 may be performed. As shown in Step S200 and FIG. 2 to FIG. 4, a plurality of electronic units 200 are provided to the plurality of recesses 100R. The electronic unit 200 may be a semiconductor unit, for example, including a chip, a light-emitting diode, a micro light-emitting diode, a transistor, a resistor, a capacitor, a varactor, etc. The shape of the electronic unit 200 may be a tetragon (e.g., a square or a rectangle), a circle or an oval. According to the embodiment of the present disclosure, since the first portion R1 of each recess 100R has a larger size, each of the electronic units 200 may individually enter the first portion R1 of one recess 100R easily, that is, the electronic units 200 are distributed to the approximate positions first and allowed to move inside the first portions R1 (i.e., move in the interior of the first portions R1), while the second portion R2 of each recess 100R is used to effectively position or fix the electronic unit 200. The term "inside/interior" mentioned in the present disclosure may refer to the area, range or space corresponding to the structure which is referred to. In some embodiments, the contour shape of the second portion R2 of the recess 100R may correspond to the shape of the electronic unit 200. For example, the electronic unit 200 may be circular and the contour of the second portion R2 is a part of a circular pattern (as shown in an example (I) of FIG. 7), or the electronic unit 200 may be tetragonal and the contour of the second portion R2 is a part of a tetragonal pattern (as shown in the top view of FIG. 8), but not limited herein. In other embodiment, the contour shape of the second portion R2 of the recess 100R may not correspond to the shape of the electronic unit 200. For example, the electronic unit 200 is tetragonal and the second portion R2 is a part of a circular pattern (as shown in the top view of FIG. 3). In addition, the first portion R1 and the second portion R2 may be composed of different shapes. For example, the first portion R1 is similar to a circle and the second portion R2 is similar to a rectangle, but the size of the first portion R1 is still greater than the size of the second portion R2.

Each electronic unit 200 may have a maximum distance D1 in the size itself. For example, the maximum distance D1 of the electronic unit 200 may be the diagonal distance when the shape of the electronic unit 200 is a tetragon (as shown in the top view of FIG. 4), the maximum distance D1 of the electronic unit 200 may be the diameter when the shape of the electronic unit 200 is a circle (as shown in the example (I) of FIG. 7), and the maximum distance D1 of the electronic unit 200 may be the distance of long axis when the electronic unit 200 is an oval (not shown). The size of the electronic unit 200 described above may be a top-view area thereof as an example. The projected area of the electronic unit 200 on the substrate structure 100 in the direction Z may be regarded as the size thereof, for example. According to the embodiment of the present disclosure, the maximum width W1 of the first portion R1 of the recess 100R is greater than 1.5 times the maximum distance D1 of the electronic unit 200, so that the electronic unit 200 may be disposed inside the first portion R1 easily, and the maximum width W1 of the first portion R1 is less than twice the maximum distance D1 of the electronic unit 200, so that only one electronic unit 200 may be accommodated in the first portion R1, avoiding the situation that two or more electronic units 200 are disposed inside the same first portion R1, that is, $D1*1.5<W1<D1*2$. In addition, the second portion R2 of each recess 100R may have a maximum distance D2 in the direction X (as shown in FIG. 2), wherein the maximum distance D2 is greater than one third of the maximum distance D1 of the electronic unit 200, so that the electronic unit 200 may be accommodated into the second portion R2 with a certain depth in the direction X, and the maximum distance D2 of the second portion R2 is smaller than the maximum distance D1 of the electronic unit 200, so as to limit the offset range of the electronic unit 200, that is, $D1*1/3<D2<D1$. According to the corresponding shape design of the second portion R2, the electronic unit 200 may be positioned or fixed more effectively. For example, the rectangular electronic unit 200 may be positioned in the rectangular second portion R2, or the corresponding range of the second portion R2 shown in cross-sectional view at the lower-right part of FIG. 2 may have a relatively recessed landform, or the above maximum distance D2 may be designed as being smaller and greater than one sixth of the maximum distance D1 (i.e., $D2>D1*1/6$), so as to save more space and make the pitch of the array arranged by the electronic units 200 smaller, so that the electronic device may achieve higher resolution.

In some embodiments, the plurality of electronic units 200 may be provided to the plurality of recesses 100R at the same time through a fluid mass transfer process, for example (but not limited to), a fluid transfer process carried out by a inkjet printing method, and additionally, a magnetic fluid transfer may also be an option. The following is illustrated with the inkjet printing method as an example. As shown in FIG. 2, Step S200 of providing the plurality of electronic units 200 to the plurality of recesses 100R may be carried out through an electronic unit wet supply module 300 (referred to as a first electronic unit wet supply module). The electronic unit wet supply module 300 may include a nozzle unit 302 configured to provide liquid LQ containing the electronic units 200 onto the substrate structure 100. The size of the nozzle unit 302 is, for example, a width 302W of the outlet of the nozzle unit 302 in the direction X or an area of the outlet thereof, and the size of one droplet of the liquid LQ dripped by the nozzle unit 302 at one time may be referred to as a droplet size QD1. In some embodiments, the size of the nozzle unit 302 (e.g., the width 302W) and the droplet size QD1 of the nozzle unit 302 may correspond to multiple recesses 100R of the substrate structure 100, for example (but not limited to), corresponding to the recesses 100R in one region FR marked by a dotted-frame in FIG. 2. That is to say, the droplet size QD1 of nozzle unit 302 of the electronic unit wet supply module 300 may provide multiple electronic units 200 to one region FR of the substrate structure 100, and the plurality of electronic units 200 may be provided to the plurality of regions FR of the substrate structure 100 in sequence or at the same time by repeating the above steps or performing the above steps through a plurality of nozzle units 302.

In some embodiments, as shown in FIG. 3 and FIG. 4, the step of providing the plurality of electronic units 200 to the plurality of recesses 100R may further be carried out through a pressurization module 400 (referred to as a second pressurization module), wherein FIG. 3 shows the state before the pressurization module 400 moves, and FIG. 4 shows the state after the pressurization module 400 moves. Specifically, as shown in FIG. 3, after the liquid LQ is dripped, the electronic units 200 in the liquid LQ may enter the first portions R1 of the plurality of recesses 100R by the influence of gravity. However, some electronic units 200 may not enter the recesses 100R, so that there may be no electronic units 200 accommodated in the interiors of some recesses 100R. At this time, the positions of the electronic units 200 in the recesses 100R are not fixed and the electronic units 200 are movable. Then, as shown in FIG. 3 and FIG. 4, the pressurization module 400 may be used to move along a direction parallel to the surface of the substrate structure 100 and pressurize the electronic units 200, so as to enable the electronic units 200 to move and be disposed in the second portions R2 of the recesses 100R. For example, the pressurization module 400 may move along the direction X and pressurize the electronic units 200, so as to move the electronic units 200 located inside the first portions R1 of the recesses 100R to the inside of the second portions R2 of the recesses 100R along the direction X, and the pressurization module 400 may further remove the electronic units 200 not located inside the recesses 100R or the redundant electronic units 200 at the same time. Further, the pressurization module 400 may push the electronic units 200 located outside the recesses 100R into the vacant recesses 100R, and further pressurize these electronic units 200 into the interior of the second portions R2 of the recesses 100R. As shown in FIG. 3, the size of the pressurization module 400 may correspond to one region FR of the substrate structure 100. For example, a length 400L of the pressurization module 400 may be similar to or slightly greater than the length of the region FR in the direction Y, but not limited herein. In other embodiments, the size of the pressurization module 400 may correspond to the sum of the lengths of multiple regions FR or the whole substrate structure 100. In some embodiments, the surface of the pressurization module 400 may have a mesh fiber design or nano-microstructures, so that the pressurization module 400 may further absorb the liquid LQ during the push and pressurizing process when the pressurization module 400 moves, or the liquid LQ may be evaporated by heating, wherein the above two steps may also be carried out together, thereby removing the liquid LQ on the substrate structure 100.

After Step S200, Step S300 may be performed. As shown in Step S300 and FIG. 5, a location of at least one of the plurality of electronic units 200 is detected, so as to determine whether the at least one of the plurality of electronic units 200 is disposed in one of the second portions R2 of the plurality of recesses 100R. Specifically, an image of the location of at least one electronic unit 200 or an image of at least one region FR may be captured by a detection device DT, so as to determine whether the electronic unit 200 in the image is disposed in the second portion R2 of the recess 100R, that is, whether the electronic unit 200 is positioned in a correct location. The detection device DT may include, for example, a camera, an automated optical inspection (AOI) system, a charge coupled device (CCD) or other suitable detection devices. In some embodiments, each of the regions FR may be detected by the detection device DT, and location comparison of the obtained images may be carried out one-by-one. In other embodiments, the plurality of regions FR may be detected by the detection device DT, and then the obtained images are combined into a large image corresponding to the substrate structure 100, and the coordinates of each location on this image are set correspondingly, so as to compare the locations as a whole, but not limited herein.

Figure 7:
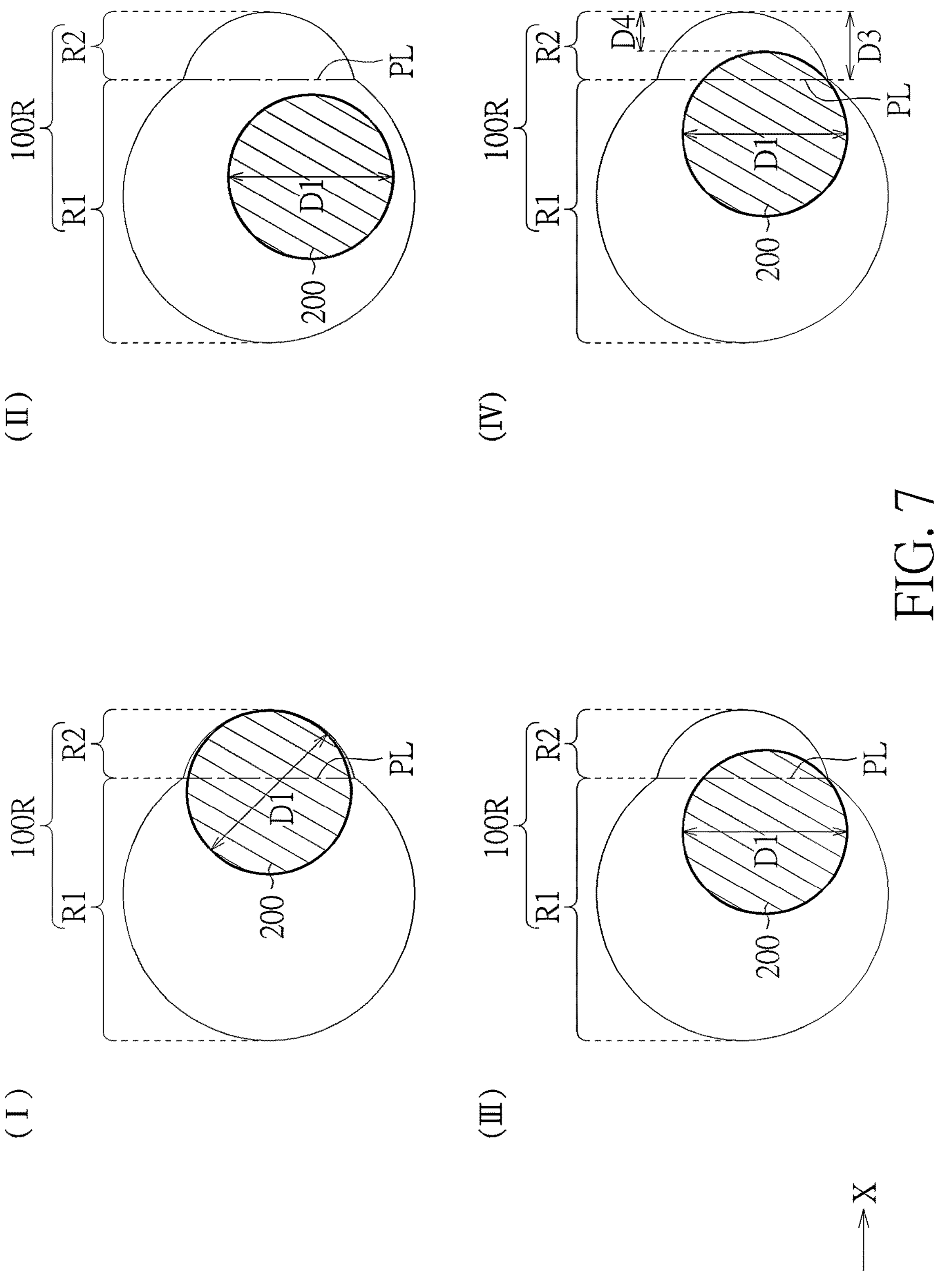
FIG. 7 is a top-view schematic diagram illustrating some embodiments that an electronic unit is disposed inside a recess according to the present disclosure.

After Step S300, Step S400 may be performed. As shown in Step S400 and FIG. 6, when the at least one (i.e., one or more) of the plurality of electronic units 200 is disposed in a defective location, further position the above at least one (i.e., one or more) of the plurality of electronic units 200 in the interior(s) of one or more of the second portions R2 of the plurality of recesses 100R. That is to say, if it is found that the electronic unit 200 is disposed in the defective location or not in a correct location after detecting, the electronic unit 200 may be moved to enable the electronic unit 200 to be positioned inside the second portion R2 of the recess 100R, for example. The terms "correct location" and "defective location" mentioned in the present disclosure may refer to the embodiments shown in FIG. 7. FIG. 7 is a top-view schematic diagram illustrating some embodiments that an electronic unit is disposed inside a recess according to the present disclosure, which are images including the contour of the electronic unit 200 and the contour of the recess 100R captured by the detection device DT respectively. The example (I) of FIG. 7 shows the condition that the electronic unit 200 is disposed in the correct location, that is, the electronic unit 200 with a certain proportion is disposed inside the second portion R2 of the recess 100R. For example, that the electronic unit 200 with a proportion ranging from one-half to one-third is positioned in the second portion R2 may means that the electronic unit 200 is disposed in the correct location, but not limited herein. An example (II), an example (III) and an example (IV) of FIG. 7 show the conditions that the electronic unit 200 is disposed in the defective location. According to the example (II) of FIG. 7, the electronic unit 200 does not enter the second portion R2 of the recess 100R at all, which means that the electronic unit 200 is disposed in the defective location. According to example (III) of FIG. 7, comparing the overlapping area of the electronic unit 200 and the second portion R2 of the recess 100R, when the area of the overlapping portion of the electronic unit 200 and the second portion R2 is less than half the area of the second portion R2, it means that the electronic unit 200 is disposed in the defective location. According to the example (IV) of FIG. 7, in the direction X, a maximum distance D3 exists between the virtual line PL, which is between the first portion R1 and the second portion R2, and the contour of the second portion R2, and a minimum distance D4 exists between the contour of the electronic unit 200 and the contour of the second portion R2. Comparing the distance D3 and the distance D4, when the distance D4 is greater than the distance D3, it means that the electronic unit 200 is disposed in the defective location.

In some embodiments, as shown in FIG. 6, Step S400 of positioning the at least one of the plurality of electronic units 200 may be carried out through a pressurization module 410 (referred to as a first pressurization module). Specifically, the pressurization module 410 may move along the direction X and pressurize the electronic unit 200 disposed in the defective location, so as to move the electronic unit 200 to the second portion R2 of the recess 100R along the direction X. The size of the pressurization module 410 may correspond to the range of one recess 100R. For example, in the direction Y, a length 410L of the pressurization module 410 may be similar to or slightly greater than the length of one recess 100R, and/or the length 410L may be less than a width CW of a line connecting the centers of two recesses 100R, and thus the length 410L of the pressurization module 410 may be less than the length 400L of the pressurization module 400. In some embodiments, the pressurization module 410 needs to maintain as not rotating during the push and pressurizing process, or a rotation direction 410R of the pressurization module 410 is different from a forward-moving direction 410F (i.e., a direction of moving forward) of the pressurization module 410. For example, the forward-moving direction 410F of the pressurization module 410 may be the same as the direction X, and the rotation direction 410R of the pressurization module 410 may be clockwise, so that a tangential-velocity direction 410V at a contact point 410P between the pressurization module 410 and the electronic unit 200 may be opposite to the direction X. That is to say, comparing the rotation direction 410R of the pressurization module 410 with the forward-moving direction 410F thereof in the same dimension (e.g., in the direction parallel to the direction X), the rotation direction 410R is different from the forward-moving direction 410F. In some embodiments, Step S400 of positioning the at least one of the plurality of electronic units 200 may be carried out through a pick and place process. That is, the electronic unit 200 disposed in the defective location may be moved to the inside of the second portion R2 of the recess 100R by the stamping device ST as shown in FIG. 8, but not limited herein.

After Step S300 is performed to detect the location of at least one of the plurality of electronic units 200, if it is found that there is any one (or any ones) of the recesses 100R on the substrate structure 100 has no electronic unit 200 disposed inside, Step S500 may be further performed: positioning another electronic unit 200 (or other electronic units 200) in the above any one (or any ones) of the second portions R2 of the plurality of recesses 100R. That is to say, another electronic unit 200 (or other electronic units 200) may be supplemented to the inside of the recess 100R lacking the electronic unit 200 to repair the abnormality. Please refer to FIG. 8, which is a schematic diagram illustrating a portion of the process of a method for manufacturing an electronic device according to an embodiment of the present disclosure, wherein the left part of FIG. 8 schematically shows a partial top-view of the process, which corresponds to one of the regions FR of the substrate structure 100, and the right part of FIG. 8 schematically shows a partial cross-sectional view of the process corresponding to the section line A-A' in the left top-view. As shown in FIG. 8, Step S500 of positioning the another electronic unit 200 in the another one of the second portions R2 of the plurality of recesses 100R may be carried out through a pick and place process. That is, another electronic unit 200 may be supplemented to the inside of the second portion R2 of the recess 100R through a stamping device ST. In this method, in order to repair more smoothly, an electronic unit 200 with a smaller size may be selected for repair. For example, the size of the repaired electronic unit may be 60% to 90% of the size of the original electronic unit. As an example, first, the location of the electronic unit 200 to be supplemented may be confirmed by the detection device DT (as shown in FIG. 5), and then the electronic unit 200 may be aligned with the second portion R2 of the recess 100R and positioned in the second portion R2 through the stamping device ST. In some embodiments, when the electronic unit 200 is aligned with the second portion R2 by the stamping device ST, the stamping device ST may approach the substrate structure 100 first, and then the electronic unit 200 on the stamping device ST may be detached by laser and fall into the second portion R2, but not limited herein. For example, the adhesive or sacrifice layer between the stamping device ST and the electronic unit 200 may lose the viscosity thereof by being heated through laser, so as to detach the electronic unit 200.

In some embodiments, Step S500 of positioning another electronic unit 200 to the second portion R2 of one of the plurality of recesses 100R may include the following steps. First, the another electronic unit 200 is provided to another first portion R1 of the plurality of recesses 100R through a pick and place process. That is to say, another electronic unit 200 may be supplemented to the inside of the first portion R1 by the stamping device ST as shown in FIG. 8. For example, the location of the electronic unit 200 to be supplemented may be confirmed by the detection device DT (as shown in FIG. 5) first, and then the electronic unit 200 may be positioned inside the first portion R1 of the recess 100R by the stamping device ST. In some embodiments, when the electronic unit 200 is aligned with the first portion R1 by the stamping device ST, the stamping device ST may approach the substrate structure 100 first, and then the electronic unit 200 on the stamping device ST may be detached by laser and fall into the first portion R1, but not limited herein. After the step of providing another electronic unit 200 to the inside of the first portion R1, the above another electronic unit 200 may be moved from the first portion R1 to the inside of the second portion R2 through a pressurization module 410 as shown in FIG. 6. The pressurization module 410 may move along the direction X and pressurize the electronic unit 200, so as to move the electronic unit 200 located inside the first portion R1 of the recess 100R to the inside of the second portion R2 of this recess 100R along the direction X.

In some embodiments, as shown in FIG. 8, the electronic unit 200 may be tetragonal and the contour of the second portion R2 is a part of a tetragonal pattern, but not limited herein. A side of the electronic unit 200 corresponding to that enters the second portion R2 may have a length L1 in the direction Y, and the second portion R2 of the recess 100R may have a length L2 in the direction Y, wherein the length L2 may be greater than or approximately equal to the length L1. For example, the length L2 of the second portion R2 may be equal to the corresponding length L1 of the side of the electronic unit 200 entering the second portion R2 when the electronic unit 200 is square, while the length L2 of the second portion R2 may be equal to the corresponding length L1 of the long side or the short side of the electronic unit 200 entering the second portion R2 when the electronic unit 200 is rectangular, such that the electronic unit 200 may enter the second portion R2 with directionality.

Figure 9:
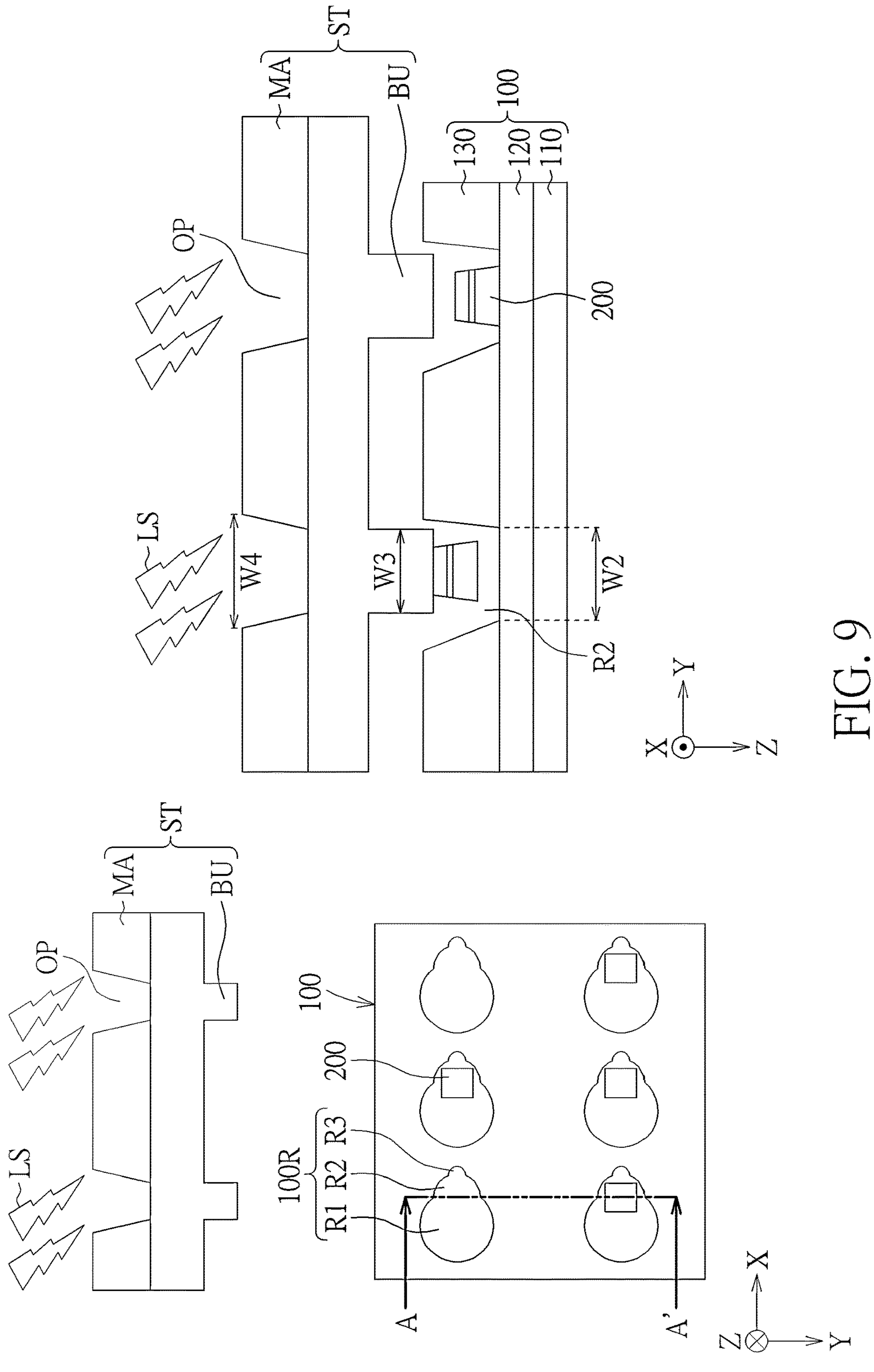
FIG. 9 is a schematic diagram illustrating a portion of the process of a method for manufacturing an electronic device according to an embodiment of the present disclosure.

Please refer to FIG. 9, which is a schematic diagram illustrating a portion of the process of a method for manufacturing an electronic device according to an embodiment of the present disclosure, wherein the left part of FIG. 9 schematically shows a partial top-view of the process, which corresponds to one of the regions FR of the substrate structure 100, and the right part of FIG. 9 schematically shows a partial cross-sectional view of the process corresponding to the section line A-A' in the left top-view. According to the embodiment shown in FIG. 9, after Step S300 is performed, if it is detected and found that there is any one (or any ones) of the recesses 100R on the substrate structure 100 has no electronic unit 200 disposed inside, the location of the recess 100R without disposing the electronic unit 200 may be obtained according to the detection result, and then Step S500 of additionally disposing another electronic unit 200 inside the second portion R2 of the recess 100R is carried out through the pick and place process and the laser process, so as to repair the abnormality. As shown in FIG. 9, the stamping device ST may include a bump BU for picking the electronic unit 200, wherein a width W3 of the bump BU in the direction Y is less than the maximum width W2 of the second portion R2 of the recess 100R in the direction Y. The bump BU may make the electronic unit 200 closer to the substrate structure 100 when the stamping device ST picks the electronic unit 200, so that the electronic unit 200 may be transferred to the substrate structure 100 more accurately. Further, the width limitation of the bump BU may enable the electronic unit 200 not to touch the substrate structure 100 when transferring. The surface of stamping device ST may optionally include a mask MA thereon, and according to the detection result, a plurality of openings OP may be formed on the side of the mask MA opposite to the substrate structure 100 corresponding to the locations where the electronic units 200 needs to be supplemented, wherein the width W4 of the opening OP in the direction Y is greater than the width W3 of the bump BU in the direction Y. For example, the openings OP may be formed by a process of photoresist or microelectromechanical systems (MEMS), but not limited herein. The laser LS may detach the electronic units 200 on the bumps BU through the openings OP and enable the electronic units 200 to fall into the second portions R2, and the width limitation of the opening OP may ensure that the laser LS is able to detach the electronic unit 200 on the bump BU. In some embodiments, the laser process may be performed by scanning method, and only the electronic units 200 on the bumps BU corresponding to the openings OP are detached by the laser LS, but not limited herein.

In some embodiments, the electronic units 200 on the stamping device ST may be arranged in an array. After step S300, if it is detected and found that there is any one (or any ones) of the recesses 100R on the substrate structure 100 has no electronic unit 200 disposed inside, the location of the recesses 100R without the electronic units 200 may be mapped and correspond to the locations of the electronic units 200 on the stamping device ST according to the detection result. Then, the electronic units 200 at all of the above corresponding locations on the stamping device ST are simultaneously detached and fall into the recesses 100R through laser, so as to repair the abnormality in a large range, but not limited herein.

In some embodiments, as shown in FIG. 9, the recess 100R may include a first portion R1, a second portion R2 and a third portion R3, but not limited herein. The first portion R1 and the third portion R3 are located at two opposite sides of the second portion R2 respectively, wherein the size of the first portion R1 is greater than the size of the second portion R2, and the size of the second portion R2 is greater than the size of the third portion R3. The third portion R3 and the second portion R2 of the recess 100R are demarcated by two opposite obvious turning points on the contour of the recess 100R. The third portion R3 of the recess 100R may be used to contain impurities. For example, impurities in the liquid LQ (as shown in FIG. 2) used when transferring the electronic units 200 may be guided to the inside of the third portion R3.

Please refer to FIG. 10, which is a schematic diagram illustrating a portion of the process of a method for manufacturing an electronic device according to an embodiment of the present disclosure, wherein the left part of FIG. 10 schematically shows a top-view of the process, and the right part of FIG. 10 schematically shows a partial cross-sectional view of the process corresponding to the section line A-A' in the left top-view. According to the embodiment shown in FIG. 10, Step S500 of positioning another electronic unit 200 may be carried out through an electronic unit wet supply module 310 (referred to as a second electronic unit wet supply module). The electronic unit wet supply module 310 may include a nozzle unit 312 configured to provide liquid LQ containing the electronic units 200 onto the substrate structure 100. The size of the nozzle unit 312 is, for example, a width 312W of the outlet of the nozzle unit 312 in the direction X or an area of the outlet thereof, and the size of one droplet of the liquid LQ dripped by the nozzle unit 312 at one time may be referred to as a droplet size QD2. The size of the nozzle unit 312 (e.g., the width 312W) and the droplet size QD2 of the nozzle unit 312 may correspond to one recess 100R of the substrate structure 100, so that the locations of other good products around is not affected when the electronic unit wet supply module 310 repairs the abnormality. That is to say, the size of the nozzle unit (e.g., the width 302W) of the electronic unit wet supply module 300 (shown in FIG. 2) is greater than the size of the nozzle unit (e.g., the width 312W) of the electronic unit wet supply module 310, or the droplet size QD1 of the electronic unit wet supply module 300 is greater than the droplet size QD2 of the electronic unit wet supply module 310. The volume of the droplet size QD2 of the electronic unit wet supply module 310 and the electronic unit 200 contained therein may be less than the volume of one recess 100R, so as to reduce the probability of the liquid LQ overflowing from the recess 100R. In some embodiments, another electronic unit 200 may be provided to the inside of the first portion R1 through the electronic unit wet supply module 310, and then the above another electronic unit 200 is moved from the first portion R1 to the inside of the second portion R2 through the pressurization module 410 as shown in FIG. 6, but not limited herein.

In some embodiments, as shown in FIG. 10, the insulating layer 130 has a plurality of recesses 100R, and the recesses 100R may not pass through the insulating layer 130 and may form recess portions in the insulating layer 130 without exposing the insulating layer 120. The provided electronic units 200 may be disposed on a portion of the insulating layer 130, but not limited herein.

Figure 11:
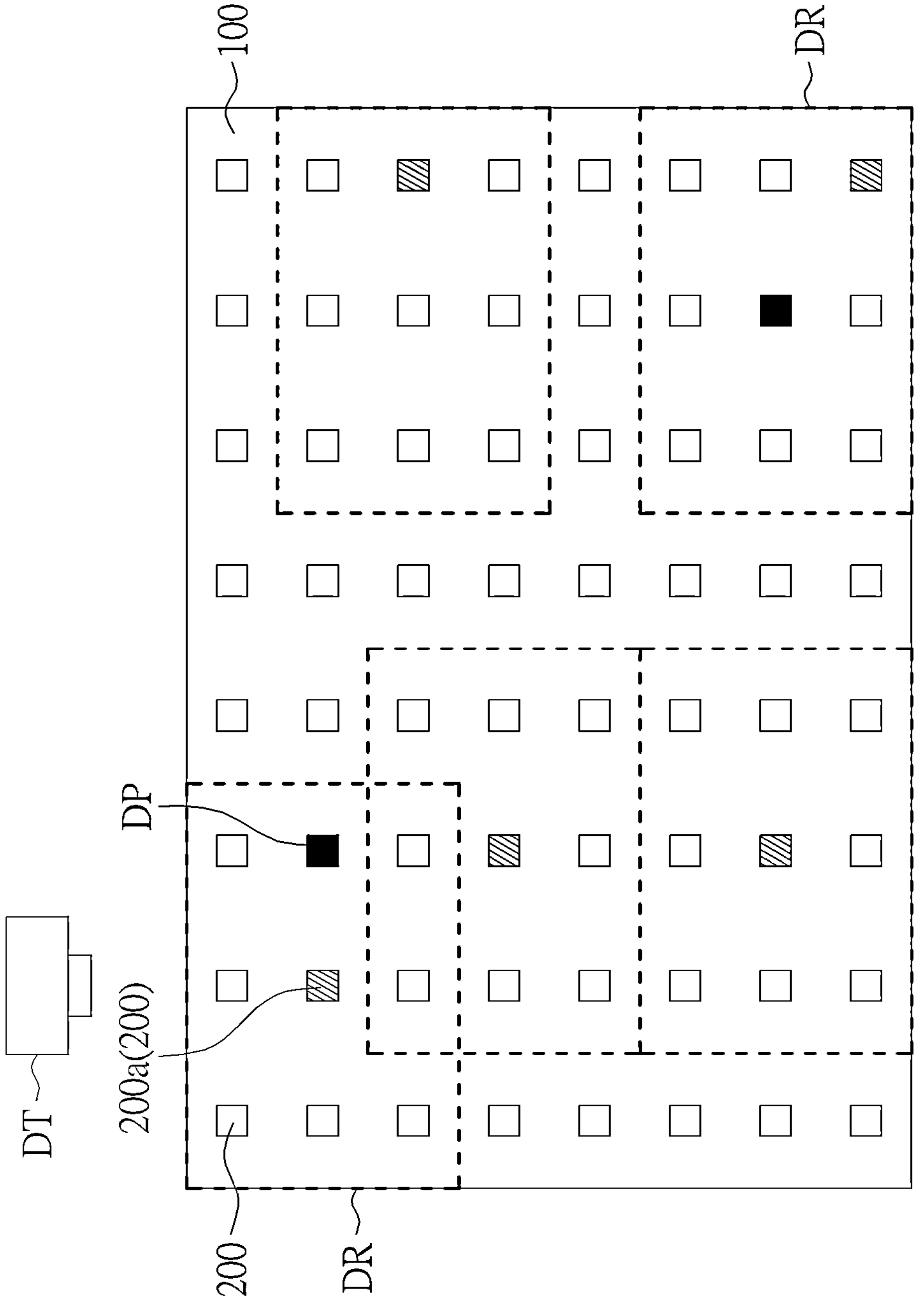
FIG. 11 is a schematic diagram illustrating a portion of the process of a method for manufacturing an electronic device according to an embodiment of the present disclosure.

After the defectiveness and abnormality is repaired through the embodiments described above, a detection may be performed again by the detection device DT. For example, the substrate structure 100 may be detected blanketly or locally to the repaired locations, or a regional range centered on the repair location may be detected. Please refer to FIG. 11, which is a schematic diagram illustrating a portion of the process of a method for manufacturing an electronic device according to an embodiment of the present disclosure. According to the embodiment shown in FIG. 11, the electronic units 200*a* (marked with oblique lines) correspond to the locations repaired by the embodiments described above. In order to confirm whether the peripheral region of the repaired locations is affected during the repair process, detection regions DR centered on the each of the electronic units 200*a* may be respectively detected by the detection device DT, wherein one detection region DR may include disposing locations of multiple electronic units 200. When the electronic unit 200*a* is located at the edge of the substrate structure 100, the detection region DR may be framed and selected inward to the inside of the substrate structure 100, as shown in the two detection regions DR at the right part of FIG. 11. Some locations DP (marked with dotted shading) that are defective and require to be repaired may be found after each of the detection regions DR is detected, and then any one of the repair methods as shown in Step S400 or Step S500 in the previous embodiments can be performed on these locations DP, so as to repair the abnormality. By repeating the above steps, the yield of the whole surface of disposing electronic units 200 on the substrate structure 100 may reach a certain level or above, for example, 99.99%.

Figure 12:
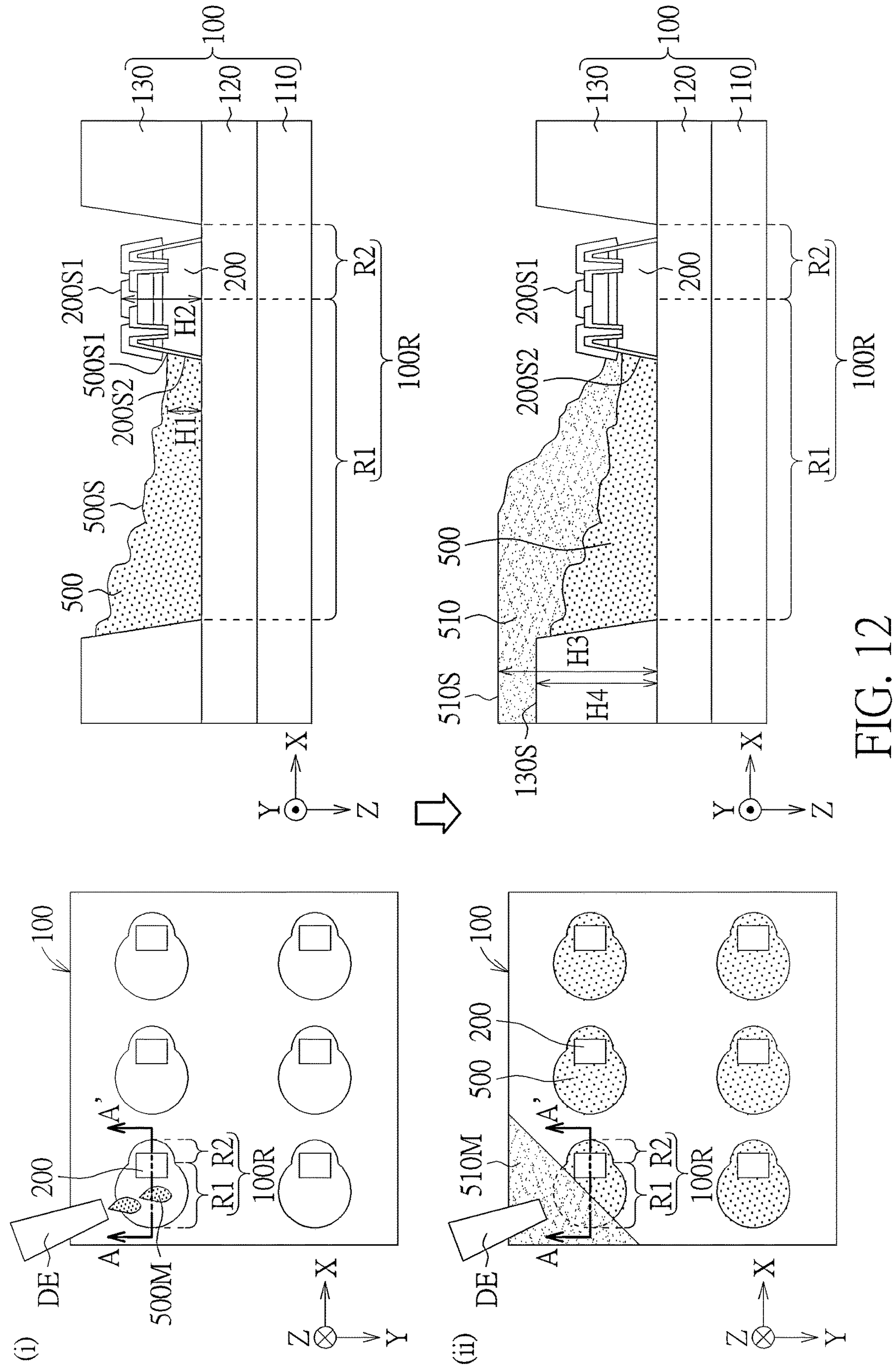
FIG. 12 is a schematic diagram illustrating a portion of the process of a method for manufacturing an electronic device according to an embodiment of the present disclosure.

Please refer to FIG. 12, which is a schematic diagram illustrating a portion of the process of a method for manufacturing an electronic device according to an embodiment of the present disclosure, wherein FIG. 12 shows a procedure (i) and a procedure (ii). The left parts of the procedure (i) and procedure (ii) schematically show a partial top-view of the process respectively, which corresponds to one of the regions FR of the substrate structure 100, and the right parts of the procedure (i) and procedure (ii) schematically show a partial cross-sectional view of the process corresponding to the section line A-A' in the left top-view respectively. After completing the repair steps of the electronic units 200 (e.g., Step S400 and/or Step S500), as shown in the procedure (i) of FIG. 12, an insulating layer 500 (referred to as a first insulating layer) may further be provided in at least one of the first portions R1 of the plurality of recesses 100R. For example, a material 500M of the insulating layer 500 may be provided to the first portion R1 of the recess 100R through a coating device DE, so that the material 500M of the insulating layer 500 may flow to the second portion R2 in a flowing way, thereby reducing the press caused by coating, which may affect the yield, such that the insulating layer 500 is formed. According to the embodiment shown in the procedure (i) of FIG. 12, the insulating layer 500 is disposed inside the recess 100R, wherein the height of a portion of a top surface 500S of the insulating layer 500 close to the electronic unit 200 may be less than that the height of a portion of the top surface 500S far away from the electronic unit 200, and the insulating layer 500 does not cover a top surface 200S1 of the electronic unit 200. Specifically, a height H1 of a portion 500S1 of the top surface 500S of the insulating layer 500 may be less than a height H2 of the top surface 200S1 of at least one of the plurality of electronic units 200, and the portion 500S1 of the top surface 500S of the insulating layer 500 may contact a side surface 200S2 of the above electronic unit 200. The height H1 and the height H2 may be measured from the same reference plane. For example, the height H1 may be measured from the top surface of the insulating layer 120 to the portion 500S1 of the top surface 500S in a direction opposite to direction Z, and the height H2 may be measured from the top surface of insulating layer 120 to the top surface 200S1 in the direction opposite to direction Z. Through the structural design of the insulating layer 500 described above, the electronic unit 200 may be maintained inside the second portion R2, or the electronic unit 200 may contact the sidewall of the insulating layer 130 corresponding to the second portion R2.

In some embodiments, as shown in the procedure (i) of FIG. 12, the insulating layer 500 may be disposed only inside the first portion R1 of the recess 100R and not inside the second portion R2 of the recess 100R. In other embodiments, the insulating layer 500 may further be disposed inside the second portion R2 of the recess 100R without covering the top surface 200S1 of the electronic unit 200. The material 500M of the insulating layer 500 may include organic materials, such as perfluoroalkoxy alkanes (PFA), resin or other suitable materials. In some embodiments, the electronic unit 200 is a light-emitting unit, such as (but not limited to) a light-emitting diode (LED). Considering optics, the material 500M of the insulating layer 500 may include a light shielding material to reduce the risk of light leakage. The light shielding material is, for example, an opaque material or a material with a light transmittance of 40% or less. In order to achieve a better contrast, the light shielding material may further be a material with a light transmittance of less than 20% or less than 10% by adjusting the material concentration or increasing the layer thickness of the material, or still further a material with a light transmittance of less than 5%. The light shielding material may include black resin, light-absorbing nano-metal, organic material mixed with chromium (Cr) or other suitable materials, but not limited herein. Through the design of the above material selection, the optical taste may be improved.

The term "light transmittance of material" mentioned in the present disclosure may be obtained by selecting a region with a specific material and a region without the specific material, measuring the light transmittance of the two regions respectively, and then making the two values be divided with each other. For example, a first region has the insulating layer 500, the insulating layer 120 and the base layer 110, and the light transmittance of the first region is measured to be 56%; and a second region has the insulating layer 120 and the base layer 110, and the light transmittance of the second region is measured to be 80%. The light transmittance of the first region is divided by the light transmittance of the second region, so as to obtain the light transmittance of the insulating layer 500 to be 70%, that is, $^{56}/_{80}$=70%. The light transmittance may refer to the percentage of luminous flux after passing through an object or a layer to the luminous flux of incident light thereof. For example, the light source may be regarded as 100%, and the light transmittance refers to the ratio obtained because of attenuation after passing through an object or a layer.

After the procedure (i) of FIG. 12, as shown in the procedure (ii) of FIG. 12, an insulating layer 510 (referred to as a second insulating layer) may further be provided on the insulating layer 500 and the plurality of electronic units 200. For example, the material 510M of the insulating layer 510 may be coated on the insulating layer 500 by the coating device DE to form the insulating layer 510, so as to obtain the manufactured electronic device. The insulating layer 510 that is completed may refer to the insulating layer 510 shown in FIG. 13. The insulating layer 510 may cover and be overlapped with at least a portion of the insulating layer 500 and at least a portion of each electronic unit 200. For example, a height H3 of a top surface 510S of the insulating layer 510 may be greater than a height H4 of a top surface 130S of the insulating layer 130, and the insulating layer 510 may serve as a planarization layer, but not limited herein. The height H3 and the height H4 may be measured from the same reference plane. For example, the height H3 may be measured from the top surface of the insulating layer 120 to the top surface 510S in a direction opposite to direction Z, and the height H4 may be measured from the top surface of insulating layer 120 to the top surface 130S in the direction opposite to direction Z. The material 510M of the insulating layer 510 may include a transparent material to reduce the influence on the operation of the electronic units 200. The transparent material may include resin, polymer or other suitable materials, but not limited herein. The transparent material, for example, has a light transmittance of at least 50%, and in order to achieve better light-transmitting efficiency, the transparent material may be a material with a light transmittance of more than 70%, or still further a material with a light transmittance of more than 80% by reducing the thickness of the layer.

Figure 13:
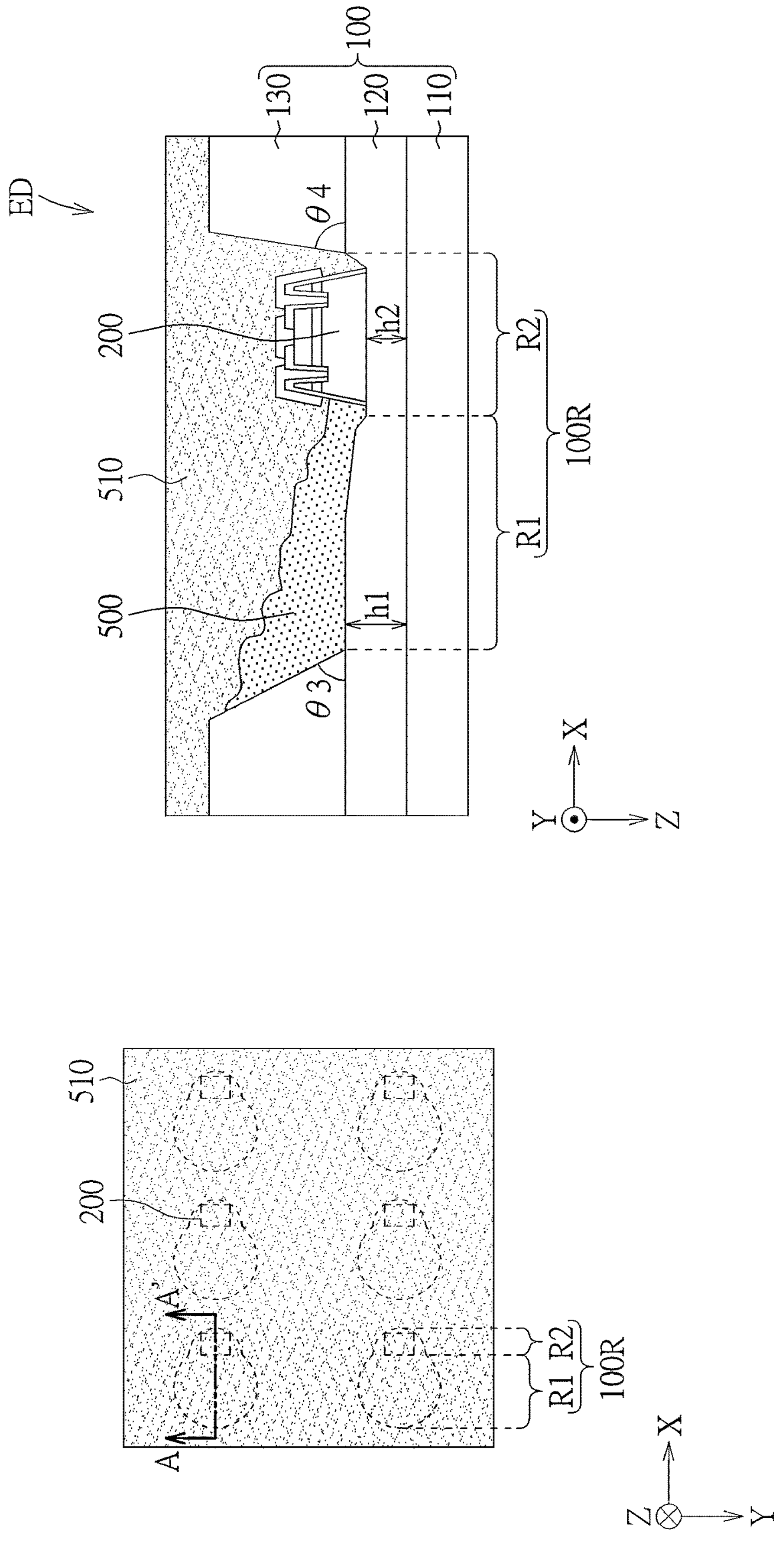
FIG. 13 is a schematic diagram illustrating a portion of the process of a method for manufacturing an electronic device according to an embodiment of the present disclosure.

Please refer to FIG. 13, which is a schematic diagram illustrating a portion of the process of a method for manufacturing an electronic device according to an embodiment of the present disclosure, wherein the left part of FIG. 13 schematically shows a partial top-view of the process, which corresponds to one of the regions FR of the substrate structure 100, and the right part of FIG. 13 schematically shows a partial cross-sectional view of the process corresponding to the section line A-A' in the left top-view. As shown in FIG. 13, after the step of providing the insulating layer 510 (as shown in the procedure (ii) of FIG. 12) is completed, the manufactured electronic device ED may be obtained, wherein the height H3 of the top surface 510S of the formed insulating layer 510 may be greater than the height H4 of the top surface 130S of the insulating layer 510, and the insulating layer 510 may serve as a planarization layer. According to the structural design of the required electronic device ED, other component structures such as layers, circuits, wires, electronic elements and/or bonding pads may be formed on the insulating layer 510.

In some embodiments, as shown in FIG. 13, the first portion R1 and the second portion R2 of the recess 100R may be respectively stamped and formed by different molds and/or pressures, but not limited herein. For example, the location corresponding to the second portion R2 may be stamped with a larger pressure, and a more depressed portion may be formed on the insulating layer 120. That is to say, in the direction Z, a portion of the insulating layer 120 corresponding to the first portion R1 of the recess 100R may have a thickness h1, and a portion of the insulating layer 120 corresponding to the second portion R2 of the recess 100R may have a thickness h2, wherein the thickness h2 may be less than the thickness h1, so that the electronic unit 200 may be positioned inside the second portion R2 more easily.

In some embodiments, as shown in FIG. 13, the sidewalls of the insulating layer 130 corresponding to the first portion R1 and the second portion R2 of the recess 100R may have asymmetric angle designs. For example, an included angle θ3 may exist between a sidewall of the insulating layer 130 corresponding to the first portion R1 and the top surface of the insulating layer 120, and an included angle θ4 may exist between a sidewall of the insulating layer 130 corresponding to the second portion R2 and the top surface of the insulating layer 120, wherein the included angle θ3 may be less than the included angle θ4. Since the electronic unit 200 may be moved from the location close to the sidewall of the insulating layer 130 corresponding to the first portion R1 to the inside of the recess 100R through the pressurization module, the electronic unit 200 may be damaged less easily by designing the included angle θ3 to be small and the slope of the corresponding sidewall to be gentle.

From the above description, according to the methods for manufacturing electronic devices of the embodiments of the present disclosure, through the design of recesses of the substrate structure, it may be beneficial for disposing electronic units. In addition, by detecting the location of the electronic unit and repairing the abnormality during the manufacturing process, the yield and/or reliability of the product may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing an electronic device, comprising following steps:

providing a substrate structure having a plurality of recesses, wherein each of the plurality of recesses has a first portion and a second portion connected to the first portion, and an area of the first portion is greater than an area of the second portion;

providing a plurality of electronic units to the plurality of recesses;

detecting a location of at least one of the plurality of electronic units, so as to determine whether the at least one of the plurality of electronic units is disposed in one of the second portions of the plurality of recesses; and positioning the at least one of the plurality of electronic units in the one of the second portions of the plurality of recesses when the at least one of the plurality of electronic units is disposed in a defective location.

2. The method for manufacturing the electronic device of claim 1, further comprising a step of:

positioning another electronic unit in another one of the second portions of the plurality of recesses.

3. The method for manufacturing the electronic device of claim 2, wherein the step of positioning the another electronic unit in the another one of the second portions of the plurality of recesses is carried out through a pick and place process.

4. The method for manufacturing the electronic device of claim 2, wherein the step of positioning the another electronic unit to the another one of the second portions of the plurality of recesses comprises:

providing the another electronic unit to another first portion of the plurality of recesses through a pick and place process; and moving the another electronic unit from the another first portion of the plurality of recesses to the another one of the second portions of the plurality of recesses through a pressurization module.

5. The method for manufacturing the electronic device of claim 2, wherein the step of providing the plurality of electronic units to the plurality of recesses is carried out through a first electronic unit wet supply module, the step of positioning the another electronic unit is carried out through a second electronic unit wet supply module, and a size of a nozzle unit of the first electronic unit wet supply module is greater than a size of a nozzle unit of the second electronic unit wet supply module.

6. The method for manufacturing the electronic device of claim 2, wherein the step of providing the plurality of electronic units to the plurality of recesses is carried out through a first electronic unit wet supply module, the step of positioning the another electronic unit is carried out through a second electronic unit wet supply module, and a droplet size of the first electronic unit wet supply module is greater than a droplet size of the second electronic unit wet supply module.

7. The method for manufacturing the electronic device of claim 1, wherein the step of positioning the at least one of the plurality of electronic units is carried out through a pick and place process.

8. The method for manufacturing the electronic device of claim 1, wherein the step of positioning the at least one of the plurality of electronic units is carried out through a first pressurization module.

9. The method for manufacturing the electronic device of claim 8, wherein the step of providing the plurality of electronic units to the plurality of recesses is carried out through a second pressurization module, and a length of the first pressurization module is less than a length of the second pressurization module.

10. The method for manufacturing the electronic device of claim 8, wherein a rotation direction of the first pressurization module is different from a forward-moving direction of the first pressurization module.

11. The method for manufacturing the electronic device of claim 1, further comprising a step of:

providing a first insulating layer in at least one of the first portions of the plurality of recesses.

12. The method for manufacturing the electronic device of claim 11, wherein a height of a portion of a top surface of the first insulating layer is less than a height of a top surface of one of the plurality of electronic units, and the portion of the top surface of the first insulating layer contacts the one of the plurality of electronic units.

13. The method for manufacturing the electronic device of claim 11, wherein a material of the first insulating layer comprises a light shielding material.

14. The method for manufacturing the electronic device of claim 11, further comprising:

providing a second insulating layer on the first insulating layer and the plurality of electronic units.

15. The method for manufacturing the electronic device of claim 14, wherein a material of the second insulating layer comprises a transparent material.

* * * * *